(12) United States Patent
Onen et al.

(10) Patent No.: US 11,462,683 B2
(45) Date of Patent: Oct. 4, 2022

(54) CMOS-COMPATIBLE PROTONIC RESISTIVE DEVICES

(71) Applicant: Massachusetts Institute of Technology, Cambridge, MA (US)

(72) Inventors: Oguzhan Murat Onen, Boston, MA (US); Jesus Del Alamo, Lincoln, MA (US); Ju Li, Weston, MA (US); Bilge Yildiz, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/627,160

(22) PCT Filed: Apr. 22, 2021

(86) PCT No.: PCT/US2021/028603
§ 371 (c)(1),
(2) Date: Jan. 14, 2022

(87) PCT Pub. No.: WO2021/216842
PCT Pub. Date: Oct. 28, 2021

(65) Prior Publication Data
US 2022/0209107 A1 Jun. 30, 2022

Related U.S. Application Data

(60) Provisional application No. 63/013,902, filed on Apr. 22, 2020.

(51) Int. Cl.
*H01L 45/00* (2006.01)

(52) U.S. Cl.
CPC ........ *H01L 45/1206* (2013.01); *H01L 45/085* (2013.01); *H01L 45/145* (2013.01); *H01L 45/1616* (2013.01)

(58) Field of Classification Search
CPC . H01L 45/1206; H01L 45/085; H01L 45/145; H01L 45/1616
See application file for complete search history.

(56) References Cited

U.S. PATENT DOCUMENTS

| 5,803,575 A | 11/1998 | Warren et al. |
| 6,140,157 A | 10/2000 | Warren et al. |

(Continued)

FOREIGN PATENT DOCUMENTS

| CN | 105742497 | 12/2017 |
| JP | 63-70567 | 3/1998 |

(Continued)

OTHER PUBLICATIONS

PCT International Search Report and Written Opinion dated Jul. 26, 2021 for PCT Application No. PCT/US2021/028603; 14 pages.

(Continued)

*Primary Examiner* — Jerome Leboeuf
(74) *Attorney, Agent, or Firm* — Daly, Crowley, Mofford & Durkee LLP (57) ABSTRACT

Described are CMOS-compatible protonic resistive devices (e.g., processing elements and/or memory elements). In embodiments, a protonic resistive memory can be formed from a proton-sensitive metal oxide channel where the concentration of protons intercalated inside the layer is controlled to modulate its conductivity. The protons can initially be supplied to the material stack by an implantation method. Irradiation techniques can be implemented to increase the concentration and conductivity of protons inside the materials. Some designs can put the active layer and reservoir in direct contact, creating an electrolyte-free device. Designs provide scalable solutions for full-scale Si-integration.

16 Claims, 4 Drawing Sheets

(56) References Cited

U.S. PATENT DOCUMENTS

| | | |
|---|---|---|
| 6,304,666 B1 | 10/2001 | Warren et al. |
| 9,703,165 B2 | 7/2017 | Marcel et al. |
| 2008/0142925 A1 | 6/2008 | Bednorz et al. |
| 2009/0231911 A1 | 9/2009 | Liu et al. |
| 2017/0012083 A1 | 1/2017 | Wang et al. |
| 2017/0047513 A1 | 2/2017 | Rolandi et al. |
| 2019/0103636 A1 | 4/2019 | Li et al. |
| 2021/0407590 A1* | 12/2021 | Van Dal .............. H01L 45/1206 |

FOREIGN PATENT DOCUMENTS

| | | |
|---|---|---|
| KR | 10-1721162 | 3/2017 |
| KR | 10-2020-0139542 | 12/2020 |
| WO | WO 2009/127884 | 10/2009 |
| WO | WO 2017/216428 | 12/2017 |
| WO | WO 2019/210156 | 10/2019 |

OTHER PUBLICATIONS

X. Yao, et al. "Protonic solid-state electrochemical synapse for physical neural networks;" Nature Communications; https://doi.org/10.1038/s41467-020-16866-6, Published on Jun. 19, 2020; 10 Pages.

\* cited by examiner

CMOS-COMPATIBLE PROTONIC RESISTIVE DEVICES

CROSS REFERENCE TO RELATED APPLICATIONS

This application is a 371 National Phase Application of International Patent Application No. PCT/US2021/028603 filed Apr. 22, 2021, which application claims the benefit of U.S. Provisional Application No. 63/013,902, filed on Apr. 22, 2020, which applications are hereby incorporated herein by reference in their entirety.

BACKGROUND

The technology relates to nonvolatile programmable resistive memory elements based on proton intercalation.

Resistive memory technologies have been widely investigated for analog computing applications, particularly for realizing processors that can handle the heavy computational workloads of deep learning. In such implementations, devices are required to have a high number of programmable nonvolatile states, symmetric and fast modulation characteristics, low energy consumption and good modulation endurance. Technologies based on the formation of a conductive filament or a phase-change have not been successful due to the highly asymmetric nature of the modulation dynamics and limited number of states.

To address these concerns, battery-like systems have been proposed that rely on tuning the conductance of a channel via controlling the amounts of ionic species such as $H^+$, $Li^+$ and $Mg^+$ that are inserted into it. These devices often use materials and fabrication steps that are incompatible with CMOS processing, which significantly limits their scaling and integration capacities.

SUMMARY

This Summary introduces a selection of concepts in simplified form that are described further below in the Detailed Description. This Summary neither identifies key or essential features, nor limits the scope, of the claimed subject matter. A class of 3-terminal protonic nonvolatile memory devices is described that is formed of a metal oxide channel and Si-based layers functioning as a protonic electrolyte or reservoir. The conductivity of the metal oxide layer is tuned by controlling the concentration of intercalated protons (i.e. hydrogen ions or $H^+$). Protons are forced into/out of the metal oxide layer by application of electrical pulses to a gate element. The materials and fabrication processes that are utilized are compatible with mainstream CMOS manufacturing.

Some embodiments relate to a 3-terminal protonic memory comprising an active stack of a first metal oxide layer working as the active channel in direct contact with a phosphorous-containing oxide layer working as the solid-electrolyte, in direct contact with a second metal oxide layer working as the proton reservoir.

Some embodiments relate to a 3-terminal protonic memory comprising an active stack of a metal oxide layer working as the active channel in direct contact with a phosphorous-containing oxide layer working as the solid-electrolyte, in direct contact with a hydrogen soluble metal working as the proton reservoir.

Some embodiments relate to a protonic memory comprising an active stack of a metal oxide layer working as the active channel in direct contact with a phosphorous-containing insulating layer working as a proton reservoir and electrolyte, all encapsulated by a proton barrier layer.

Any of the foregoing may be embodied as at least, and not limited to, a device, an article of manufacture, a method of operating such a device, an apparatus, such as a memory element or a computing element including analog computers, a computer that performs deep learning operations, or as a process of manufacturing such a device.

The following Detailed Description references the accompanying drawings which form a part this application, and which show, by way of illustration, specific example implementations. Other implementations may be made without departing from the scope of the disclosure.

In accordance with one aspect of the concepts described herein, a protonic resistive device comprises a proton-sensitive metal oxide channel defining an active layer; and at least one additional layer of material controlling concentration of protons intercalated inside the active layer to modulate conductivity.

In accordance with a further aspect of the concepts described herein, an electrolyte-reservoir combined protonic resistive memory comprises a metal oxide layer as proton-sensitive active layer having contacts disposed to define a channel structure, a proton containing electrolyte-reservoir layer disposed on the active layer, and a gate structure disposed over the proton containing reservoir layer.

In accordance with a still further aspect of the concepts described herein, a protonic resistive device comprises a substrate having first and second contacts disposed thereon, a first metal oxide layer having a first surface disposed over at least a portion of substrate between the first and second contact to form a metal oxide channel layer, a proton conducting solid electrolyte layer disposed over the first metal oxide layer, the proton conducting solid electrolyte layer comprising a phosphorus-doped oxide (P-doped oxide), a protonated reservoir layer disposed over the proton conducting solid electrolyte layer and a third contact disposed over the protonated reservoir layer to define a gate structure.

In some embodiments, the proton conducting solid electrolyte layer comprises at least one of: P-doped silicon dioxide ($SiO_2$); and phosphosilicate glass ($P_2O_5$ — $SiO_2$).

In some embodiments, the protonated reservoir layer comprises a second metal oxide.

In some embodiments, the protonated reservoir layer comprises a hydrogen absorbing metal layer.

In some embodiments the devices described herein include a metal oxide channel layer comprised of a proton-intercalating oxide.

In some embodiments the devices described herein include at least one metal hydrogen source layer.

In some embodiments the devices described herein include at least one hydrogen barrier layer It should be understood that the devices may comprise any combination of the aforementioned layers. It should be understood that some devices may not include each of the aforementioned layers.

In embodiments, a device comprises two metal-oxide layers with a first one of the metal-oxide layers acting as a channel layer and a second one of the metal-oxide layers acting as a proton reservoir layer. In embodiments, the proton reservoir layer comprises at least one of: tungsten trioxide $WO_3$; molybdenum trioxide ($MoO_3$); niobium pentoxide ($Nb_2O_5$), tantalum pentoxide ($Ta_2O_5$), vanadium pentoxide ($V_2O_5$), vanadium dioxide ($VO_2$), and strontium cobalt oxide ($SrCoO_{2.5}$).

In embodiments a device comprises a single metal-oxide layer, which is the channel and a proton hydrogen absorbing metal layer which acts as a reservoir.

In accordance with a still further aspect of the concepts described herein, a process of forming protonic resistive memory comprises: depositing a first metal oxide layer as proton-sensitive active layer, contacting the active layer from two ends to define a channel structure, depositing a proton conducting solid electrolyte on top of the active layer, depositing a second metal oxide layer as proton reservoir on top of the solid electrolyte, contacting the top metal oxide layer to define a gate structure, depositing an encapsulant layer of proton insulating nature, opening windows in the upper surface of the encapsulant layer to create electrical contact to the upper metal layer.

In embodiments, the process further comprises implantation of hydrogen to the top metal oxide layer as the source of protons in the stack.

In accordance with a still further aspect of the concepts described herein, a process of forming protonic resistive memory comprises: depositing a metal oxide layer as proton-sensitive active layer; contacting the active layer from two ends to define a channel structure; depositing a proton conducting solid electrolyte on top of active layer; depositing a first layer of hydrogen soluble metal; depositing a second layer of hydrogen inert metal; depositing an encapsulant layer of proton insulating nature; opening windows in the upper surface of the encapsulant layer to create electrical contact to the upper metal layer; and implanting hydrogen into the upper metal layer.

In embodiments, the process further comprises an energetic irradiation to release protons from sites they are initially bound to.

In embodiments, the process further comprises increasing the proton conductivity of the materials by increasing the porosity and vacancy concentration.

In accordance with a still further aspect of the concepts described herein, a process for making an electrolyte-free protonic resistive memory comprises: depositing a first metal oxide layer as proton-sensitive active layer; contacting the active layer from two ends to define a channel structure; depositing a proton containing electrolyte-reservoir on top of the active layer; contacting the reservoir layer to define a gate structure.

In embodiments, the process further comprises an energetic irradiation process to release protons from sites they are initially bound to.

In embodiments, the process further comprises increasing the proton conductivity of the materials by increasing the porosity and vacancy concentration.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes and are not intended as absolute references for embodied devices. An embodied device may be oriented spatially in any suitable manner that may be different from the orientations shown in the drawings. The drawings are not intended to limit the scope of the present teachings in any way.

DETAILED DESCRIPTION

Analog computing schemes using a resistive crossbar have been heavily investigated for accelerating workloads of deep learning operations. It has been long known that a crossbar array of resistors can perform a vector-matrix multiplication and addition (MAC) operation in the analog domain in a fully-parallel manner following Ohm's and Kirchhoff's Laws. Recently, it was discovered that rank-one outer product-based updates can also be performed in parallel using pulse-coincidence for multiplication and incremental conductance change of devices for accumulation. However, the strict set of device properties required for the unit cell have not yet been achieved by any approach, causing significant training performance degradation for analog processors.

Different resistive memory technologies have been proposed based on formation of a conductive filament, a phase-change in the active material and intercalation of ions. From those, proton intercalation memories have shown exciting characteristics due to the small mass and volume of the protons (hydrogen ions) leading to a high number of programmable states, ultra-low energy consumption, and a high modulation endurance.

In general, protonic memory devices include a protonic reservoir, a protonic electrolyte, and a proton-sensitive active layer (also sometimes referred to as a metal oxide channel layer). In example embodiments described herein, the proton-sensitive active layer is implemented by means of a proton-intercalating metal oxide. The conductance state of the device is determined by the concentration of protons intercalated inside the active layer. Application of electrical pulses moves protons into/out of this layer, from/to the reservoir through the electrolyte, as electrons move through the external circuit in the same direction. When the gate is electrically open, proton movement through the electrolyte is forbidden since electrons cannot flow through the outside circuit, enabling a non-volatile analog memory.

Multiple methods of reversible proton sourcing have been investigated, such as hydrolysis of water, storage in organic materials, and storage in hydrated metals. Between these design choices, using hydrated metals such as palladium (Pd), platinum (Pt), and titanium (Ti) shows the most promise from a Si-integration point of view because it does not rely on unconventional material choices such as organic polymers. Nonetheless, when aforementioned metals are exposed to air-environment post-protonation, catalyzed oxidation of the incorporated hydrogen acts as a rapid deprotonation mechanism. Therefore, even when post-processing methods for encapsulation are followed, the control over the concentration of protons contained inside the material stack is challenging.

Similarly, the electrolyte choices that are optimized to show high protonic and low electronic conductivities have also been found to involve materials that are incompatible with modern CMOS fabrication techniques such as the LaPO$_4$, CsHSO$_4$, and perfluorosulfonic acid polymer (PFSA) Nafion.

On the other hand, materials that are compatible with CMOS-processing often show good protonic conduction but only at elevated and impractical temperatures such as gadolinium-doped ceria (GDC), yttrium-doped barium zirconate (BZY), and yttria-stabilized zirconia (YSZ).

Regarding the active material, a variety of metal oxides show reversible conductance modulation with changing intercalated proton concentration, such as WO$_3$, MoO$_3$, Nb$_2$O$_5$, Ta$_2$O$_5$, V$_2$O$_5$, VO$_2$, and SrCoO$_{2.5}$. The wide-range of available proton-sensitive metal oxides provides flexibility in design such as deciding on the base (i.e. unprotonated) conductivity of the active layer, proton sensitivity and capacity.

The inventors have recognized and appreciated that CMOS-compatible solutions for proton reservoir layers and electrolyte layers can be used to realize scalable protonic resistive devices for analog computing applications. The following example implementations of such a design ultimately provide a high yield and high performance protonic resistive memory for analog computing applications.

Figure 1:
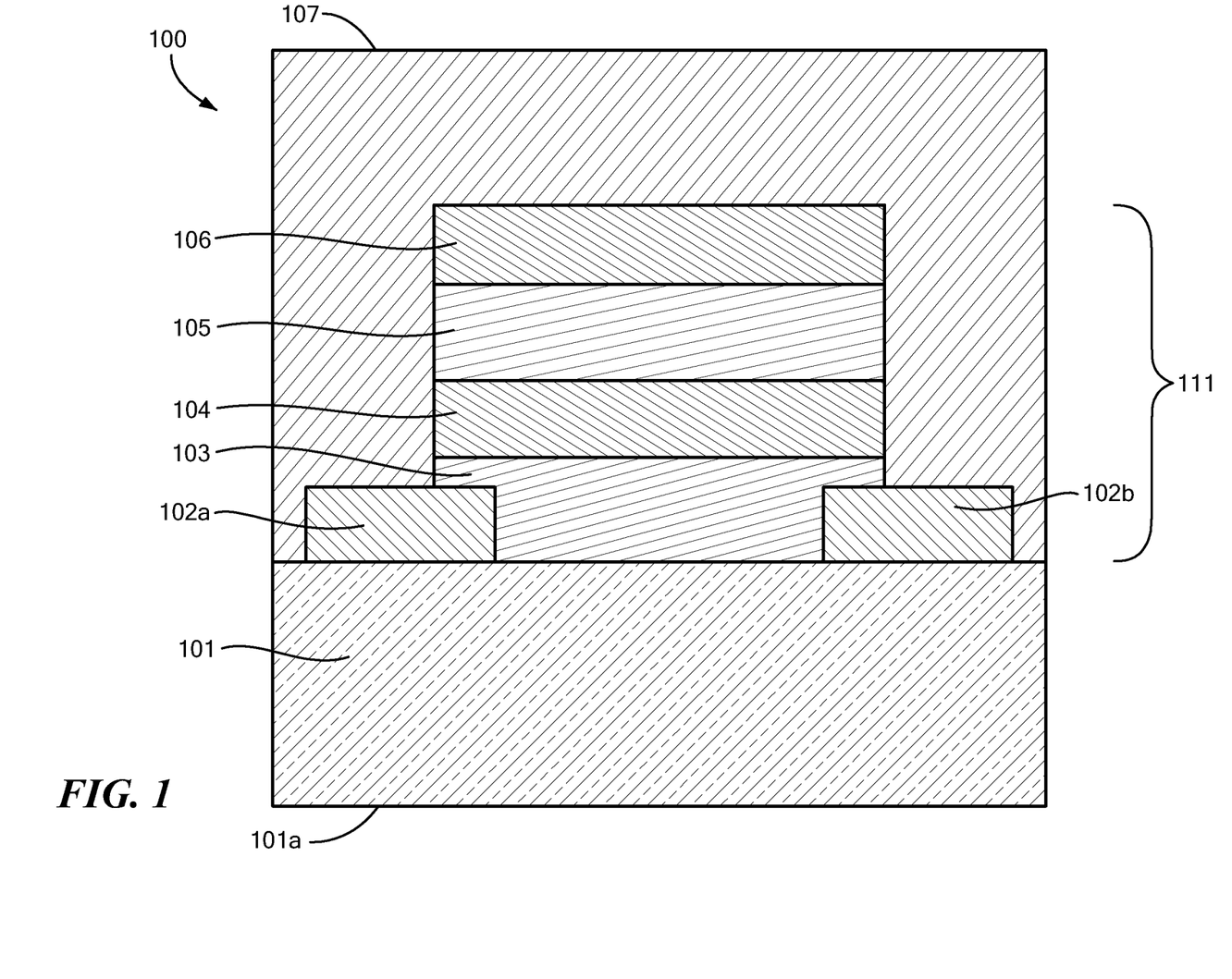
FIG. 1 is a cross-sectional view of an example embodiment of a protonic resistive memory having a symmetric active stack.

Referring now to FIG. 1, an example embodiment of a protonic resistive device 100 suitable for implementation as part of a processor capable of performing complex deep learning operations includes a device stack 111 disposed over a substrate 101. Significantly, and as will be described in detail below, the device stack 111 comprises materials (i.e. a material system) which enable protonic resistive device 100 to be fabricated via conventional complementary metal-oxide semiconductor (CMOS) fabrication techniques. Thus, protonic resistive device 100 may be referred to as a fully CMOS compatible protonic resistive device.

In embodiments, protonic resistive device 100 comprises a substrate 101 having first and second opposing surfaces 101a, 101b with device stack 111 disposed over the second surface 101b. Substrate 101 may be provided from an electronically insulating substrate material, such as quartz (SiO$_2$) or sapphire (Al$_2$O$_3$) for example. Disposed on a surface of substrate 101 are a pair of spaced-apart contacts 102a, 102b. In embodiments, contacts 102a, 102b comprise a hydrogen-inert metal.

A first metal oxide layer 103 is disposed over a surface of substrate 101 and is coupled to the hydrogen-inert metal contacts 102a, 102b to form a channel region (and hence metal oxide layer 103 may sometimes be referred to herein as a "metal oxide channel 103" or an "active channel 103" or "proton-sensitive active layer 103" or a "channel layer" or more simply a "channel"). In this example embodiment, metal oxide layer 103 is disposed over portions of contacts 102a, 102b.

Contacts 102a and 102b may, for example, comprise one or more of: copper (Cu), tungsten (W) and hydrogen annealed poly-silicon (poly-Si). Other materials including alloys may, of course, also be used.

The channel layer comprises one or more materials or alloys that intercalate protons. In one example embodiment, the active channel 103 may be fabricated by patterning a metal oxide such as tungsten trioxide (WO$_3$) over a surface of substrate 101. Other materials may also be used. For example, metal oxide layer 103 may comprise one or more of the following materials: molybdenum trioxide (MoO$_3$), niobium pentoxide (Nb$_2$O$_5$), tantalum pentoxide (Ta$_2$O$_5$), vanadium pentoxide (V$_2$O$_5$), vanadium dioxide (VO$_2$), and strontium cobalt oxide (SrCoO$_{2.5}$). Layer 103 may comprise layered transition metal oxides with protons in them, such as H$_x$CoO$_2$, H$_x$MnO$_2$, H$_x$NiO$_2$ (x is a number indicating proton content per unit formula) as well as layered titanium oxides (Ti$_x$Oy). Layer 103 may comprise metal oxides, or more specifically d-block transition metal oxides may be used. Combinations of these and other materials may be used. Layer 103 may comprise any material or combination of materials capable of forming a metal oxide channel.

An electrolyte layer 104, here provided as a proton conducting solid electrolyte layer 104, is disposed over metal oxide layer 103. In general, electrolyte layer 104 may comprise a nanoporous oxide with phosphorus doping. In this example embodiment, electrolyte layer 104 is provided as a proton conducting solid electrolyte layer comprising a phosphorous-doped oxide. In embodiments, proton conducting solid electrolyte layer 104 comprises phosphosilicate glass (PSG). In embodiments, proton conducting solid electrolyte layer 104 may comprise P-doped silicon dioxide (SiO$_2$) or phosphosilicate glass (P$_2$O$_5$-SiO$_2$) or modified versions thereof. The proton conducting solid electrolyte layer 104 is designed to have negligible electronic conductivity at operating conditions. Various combinations of materials comprising phosphorous and an oxide may be used to provide electrolyte layer 104.

In embodiments, P-doped SiO$_2$ or phosphosilicate glass (P$_2$O$_5$-SiO$_2$) may be deposited using plasma enhanced chemical vapor deposition (PECVD) techniques. Other techniques, may of course, also be used including but not limited to grafting and acid-functionalization. According to one embodiment, electrolyte layer 104 can be realized with silicon dioxide (SiO$_2$) deposited via PECVD techniques at low temperatures (e.g. temperatures below 400 ° C.). In embodiments, electrolyte layer 104 can be realized with silicon dioxide (SiO$_2$) deposited via PECVD techniques at temperatures of about 100 ° C. In embodiments, electrolyte layer 104 can be realized with silicon dioxide (SiO$_2$) deposited via PECVD techniques at temperatures in the range of about 90° C. to about 110° C.

In this example embodiment, electrolyte layer 104 is in direct contact with channel layer 103.

A second metal oxide layer 105 may be patterned or otherwise disposed in direct contact with the electrolyte layer 104. Metal oxide layer 105 acts as a proton reservoir and thus, layer 105 is sometimes referred to herein as reservoir layer 105 (or more simply as reservoir 105). Material considerations for the second metal oxide layer 105 are the same as that of the first metal oxide layer 103. Thus, metal oxide layer 105 may comprise one or more of: WO$_3$, MoO$_3$, Nb$_2$O$_5$, Ta$_2$O$_5$, V$_2$O$_5$, VO$_2$ and SrCoO$_{2.5}$. Combinations of these and other materials may be used. Any material or combination of materials capable of forming a metal oxide channel may be used to form layer 105.

In one illustrative embodiment, protonation of the reservoir layer 105 may be accomplished via a proton implantation process. In one embodiment a proton implantation process may be performed as the last step of a fabrication process.

Other methods for protonating the reservoir layer 105 include, but are not limited to, following a process such as atomic layer deposition (ALD), chemical vapor deposition (CVD) or plasma-enhanced chemical vapor deposition (PECVD) where the metal oxide is formed through a chemical reaction between two or more precursors, which leave residual hydrogen-containing biproducts inside the metal oxide layer.

In some embodiments, post-processing of the reservoir layer 105 with energetic ion, electron or photon irradiation can liberate protons from their sites, contributing to the proton concentration or conduction. The reservoir layer 105 is contacted by a gate contact 106. In embodiments, gate contact 106 is provided from a hydrogen-inert metal. Example materials for the gate contact 106 include, but are not limited to: copper (Cu), tungsten (W) and hydrogen annealed poly-Si.

A proton barrier layer 107 is disposed to encapsulate protonic memory 100 thereby retaining the protons inside the device for the extent of the device lifetime. Proton barrier layer 107 may comprise a variety of different materials including, but not limited to: silicon carbide (SiC), silicon nitride ($Si_3N_4$), aluminum oxide ($Al_2O_3$), chromium oxide ($Cr_2O_3$), yttrium oxide, ($Y_2O_3$), erbium oxide ($Er_2O_3$), titanium nitride (TiN), titanium carbide (TiC) or a layered combination of thereof. Combinations of these and other materials may be used. Any suitable material or combination of materials capable of encapsulating device 100 may be used.

It should be appreciated that in the embodiment of FIG. 1, the first and second metal oxide layers 103, 105 are symmetrical disposed about electrolyte layer 104. In other embodiments, (examples of which will be described below) such symmetry is not necessary.

It should be appreciated, and as generally known, access points (e.g. in the form of vias) may be provided (e.g. etched or otherwise provided) in layer 107 to allow physical access to contacts 102a, 102b, 106 (e.g. such that electrical connection may be made to contacts 102a, 102b, 106). Such access points are preferably far away from the active region of device 100. In embodiments, contacts 102a, 102b and 106 may correspond to source, drain and gate electrodes of the device 100.

Figure 2:
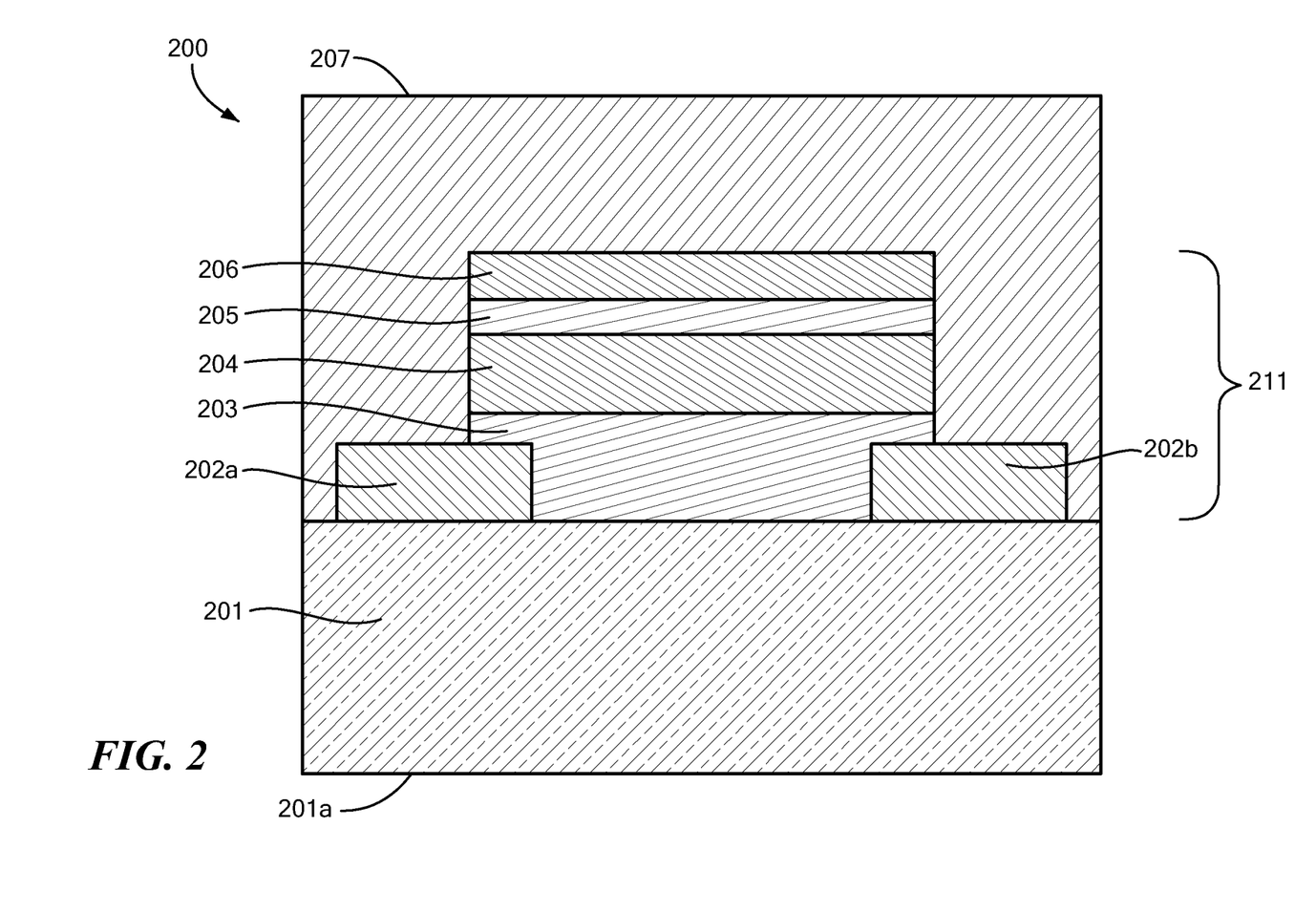
FIG. 2 is a cross-sectional view of an example embodiment of a protonic resistive memory implemented by an ion-implantation method for reservoir fabrication.

Referring now to FIG. 2, a fully-CMOS-compatible protonic resistive memory 200 includes a substrate 201 having first and second opposing surfaces 201a, 201b with a pair of contacts 202a, 202b (e.g. hydrogen-inert metal contacts) disposed on surface 201b. Substrate 201 may comprise an electronically insulating material such as quartz ($SiO_2$) or sapphire ($Al_2O_3$), for example. Example materials for the contacts 202a and 202b include, but are not limited to gold (Au).

A metal oxide active channel layer 203 is disposed over the substrate surface 201b and coupled to the two contacts 202a, 202b to form a channel region (and hence metal oxide layer 203 is also sometimes referred to as a "metal oxide channel 203" or an "active channel 203" or a "channel layer" or more simply a "channel"). The channel layer comprises one or more materials or alloys that intercalate protons. According to one embodiment, the active channel 203 may be provided or otherwise fabricated by patterning or otherwise disposing a metal oxide such as tungsten trioxide ($WO_3$). Other materials that may comprise channel layer 203 include, but are not limited to, molybdenum trioxide ($MoO_3$), niobium pentoxide ($Nb_2O_5$), tantalum pentoxide ($Ta_2O_5$), vanadium pentoxide ($V_2O_5$), vanadium dioxide ($VO_2$), and strontium cobalt oxide ($SrCoO_{2.5}$). Layer 203 may comprise layered transition metal oxides with protons in them, such as $H_xCoO_2$, $H_xMn)_2$, $H_xNiO_2$ (where x is a number indicating proton content per unit formula) as well as layered titanium oxides ($Ti_xOy$). Layer 203 may comprise metal oxides, or more specifically d-block transition metal oxides. Combinations of these and other materials may be used. Any material or combination of materials capable of forming a metal oxide channel may be used to form layer 203.

An electrolyte layer 204, here provided as a proton conducting solid electrolyte layer 204, is disposed over metal oxide layer 203. In general, electrolyte layer 104 may comprise a nanoporous oxide with phosphorus doping. In this example embodiment, electrolyte layer 204 is provided as a proton conducting solid electrolyte layer comprising a phosphorous-doped oxide. In embodiments, proton conducting solid electrolyte layer 204 comprises phosphosilicate glass (PSG). In embodiments, proton conducting solid electrolyte layer 204 may comprise P-doped silicon dioxide ($SiO_2$) or phosphosilicate glass ($P2O_5$-$SiO_2$) or modified versions thereof. In embodiments, the P-doped $SiO_2$ or phosphosilicate glass ($P2O_5$-$SiO_2$) may be deposited using plasma enhanced chemical vapor deposition (PECVD) techniques. Other techniques, may of course, also be used including but not limited to grafting and acid-functionalization. The proton conducting solid electrolyte layer 204 is designed to have negligible electronic conductivity at operating conditions. Various combinations of materials comprising phosphorous, and an oxide may be used to provide electrolyte layer 104.

In this example embodiment, electrolyte layer 204 is in direct contact with channel 203. According to one illustrative process, electrolyte layer 204 may be provided from $SiO_2$ deposited by plasma-enhanced chemical vapor deposition (PECVD) technique at low temperatures.

A hydrogen absorbing metal layer 205 is patterned or otherwise disposed over electrolyte layer 204. In embodiments, layer 205 may be in direct contact with the electrolyte layer 204. Hydrogen absorbing metal layer 205 acts as a proton reservoir and hence is sometimes referred to herein as a "reservoir layer." In one embodiment, the reservoir layer 205 can be realized by patterning or otherwise providing a layer comprising materials including, but not limited to: palladium (Pd), platinum (Pt) or titanium (Ti), Zirconium (Zr), Molybdenum (Mo), and group 5 metals including but not limited to Niobium (Nb), Vanadium (V), Tantalum (Ta), and all their alloys with each other, and with other elements. In short, reservoir layer 205 may comprise any metals and alloys which are considered as alternatives to Pd in hydrogen membrane applications—see for example, https://www-.sciencedirect.com/science/article/pii/ B9780857097682500134).

In embodiments the reservoir layer 205 may be protonated via proton implantation as the last step of fabrication. In embodiments, reservoir layer 205 may be provided as an alloy (e.g. an alloy of palladium with metallic hydrogen $PdH_x$).

The reservoir layer 205 is contacted by a gate contact 206 (e.g. a hydrogen-inert gate contact). Example materials for the gate contact 206 include but are not limited to: copper (Cu), tungsten (W), and hydrogen annealed poly-Si.

In embodiments, the protonic memory 200 may be encapsulated by a proton barrier layer 207 to retain the protons inside the device for the extent of device lifetime. Materials suitable for fabrication of the proton barrier layer 207 may comprise materials including, but not limited to, silicon carbide (SiC), silicon nitride ($Si_3N_4$), aluminum oxide ($Al_2O_3$)), chromium oxide ($Cr_2O_3$), yttrium oxide, ($Y_2O_3$), erbium oxide ($Er_2O_3$), titanium nitride (TiN), titanium carbide (TiC) or a layered combination of thereof It should be appreciated that in the embodiment of FIG. 2, the first and second metal oxide layers 203, 205 are not symmetrical disposed about electrolyte layer 204. In this example embodiment, channel layer 203 has a thickness which is greater than both the electrolyte layer 204 and the reservoir layer 205 and the electrolyte layer 204 has a thickness which is greater that the thickness of the reservoir layer 205. In embodiments, it may be desirable to provide the channel layer having a thickness selected to promote fast minimal diffusion across the channel layer for speed concerns. In embodiments, it may be desirable to provide the channel layer having a thickness on the order of about 10 nm. In embodiments, it may be desirable to provide the electrolyte layer having a thickness selected to make protons travel the shortest path, while still achieving good dielectric insulation. In embodiments, it may be desirable to provide the electrolyte layer having a thickness on the order of about 10 nm. In embodiments, the reservoir layer may be provided having a thickness selected for ease of fabrication. In one embodiment, the reservoir has a thickness of about 5 nm. In one embodiment, the reservoir is provided ad Pd layer having a thickness of about 5 nm.

Similar to the embodiment of FIG.1, access points (e.g. in the form of vias) may be provided (e.g. etched or otherwise provided) in layer 207 to allow physical access to contacts 202a, 202b, 206 (e.g. such that electrical connection may be made to contacts 202a, 202b, 206). In embodiments, contacts 202a, 202b and 206 may correspond to source, drain and gate electrodes of the device 200.

It should be appreciated that the embodiment of FIG. 1 illustrates an example device comprising two metal-oxide layers (one acting as a channel and the other acting as a reservoir) while the example embodiment of FIG. 2 illustrates a device comprising a single metal-oxide layer, which is the channel. The reservoir of FIG. 2 is a proton hydrogen absorbing metal layer (e.g. a hydrogen absorbing metal layer such as Pd).

Figure 3:
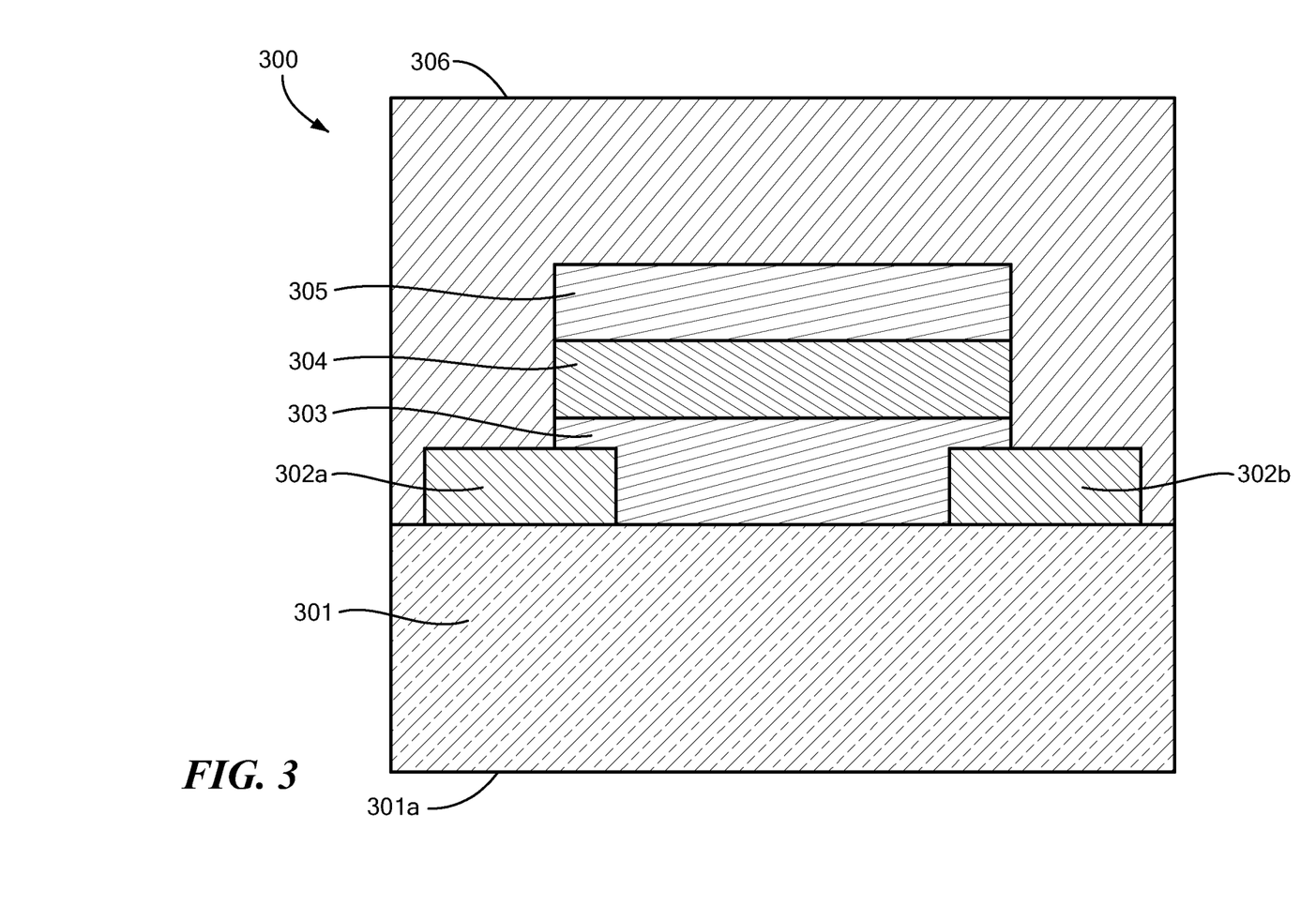
FIG. 3 is a cross-sectional view of an example embodiment of a combined electrolyte-reservoir protonic resistive memory.

Referring now to FIG. 3, another embodiment of a fully-CMOS-compatible protonic resistive device 300 that is intended for implementation for a processor capable of performing complex deep learning operations comprises a substrate having a device stack which includes a single physical material layer, corresponding to both the protonic electrolyte and the protonic reservoir layers and does not include a physical material layer corresponding to the protonic electrolyte layer as described above in conjunction with FIGS. 1 and 2. Thus, embodiments in accordance with the concepts illustrated in FIG. 3 are sometimes referred to as electrolyte-reservoir combined embodiments or as electrolyte-reservoir combined designs.

In embodiments, a metal oxide active channel 303 connected to two hydrogen-inert metal contacts 302a, 302b. An example material for the contacts 302a and 302b can be gold (Au).

According to one process, the active channel 303 can be fabricated by patterning a metal oxide such as tungsten trioxide ($WO_3$). Other materials that can be used for making the active channel 303 include, but are not limited to, molybdenum trioxide ($MoO_3$), niobium pentoxide ($Nb_2O_5$), tantalum pentoxide ($Ta_2O_5$), vanadium pentoxide ($V_2O_5$), vanadium dioxide ($VO_2$), and strontium cobalt oxide ($SrCoO_{2.5}$).

The channel 303 is in direct contact with a Si-based proton electrolyte-reservoir layer 304 comprising phosphorous-doped insulator. In embodiments, electrolyte-reservoir layer 304 may comprise P-doped silicon nitride (P-$SiN_x$). In embodiments, electrolyte-reservoir layer 304 may comprise phosphosilicate glass (PSG). In embodiments, electrolyte-reservoir layer 304 may comprise P-doped silicon dioxide ($SiO_2$) or phosphosilicate glass ($P_2O_5$-$SiO_2$) or modified versions thereof. In embodiments, the P-doped $SiO_2$ or phosphosilicate glass ($P_2O_5$-$SiO_2$) may be deposited using plasma enhanced chemical vapor deposition (PECVD) techniques. Other techniques, may of course, also be used including but not limited to grafting and acid-functionalization. Various combinations of materials comprising phosphorous and an oxide may be used to provide electrolyte-reservoir layer 304.

According to one process, the Si-based proton electrolyte-reservoir 304 (also sometimes referred to as Si-based insulator 304) may comprise P-$SiN_x$. In embodiments, the electrolyte-reservoir layer 304 can be deposited, for example, by a plasma-enhanced chemical vapor deposition (PECVD) technique at low temperatures (e.g. temperatures below 400° C.). In embodiments, the electrolyte-reservoir 304 layer may be deposited via PECVD at temperatures of about 100° C. In embodiments, the electrolyte-reservoir 304 layer may be deposited via PECVD at a temperature in the range of about 90° C. to about 110° C. In embodiments, electrolyte-reservoir 304 may comprise $Si_3N_4$. In embodiments, the $Si_3N_4$ can be deposited, for example, by a plasma-enhanced chemical vapor deposition (PECVD) technique at low temperatures (e.g. temperatures below 400° C.). In embodiments, the electrolyte-reservoir 304 layer may be deposited via PECVD at temperatures of about 100° C.

In embodiments, the electrolyte-reservoir 304 layer may be deposited via PECVD at a temperature in the range of about 90° C. to about 110° C. Other materials that can be used for making the Si-based electrolyte-reservoir layer 304 include, but not limited to, PECVD $SiO_2$, PECVD P-doped $SiO_2$, PECVD phosphosilicate glass ($P_2O_5$-$SiO_2$) and modified versions of thereof using methods including, but not limited to, grafting and acid-functionalization. Another method to create mobile protons inside the electrolyte-reservoir layer 304 include first depositing a PECVD $SiO_2$ followed by a high-temperature (e.g. 1200° C.) annealing under an inert atmosphere, finalized by a medium temperature (e.g. 350° C.) anneal in a hydrogen containing atmosphere such as forming gas. The electrolyte-reservoir layer 304 is also designed to have negligible electronic conductivity at operating conditions.

In embodiments, protonation of the reservoir layer 304 may be accomplished via a proton implantation process. In one embodiment a proton implantation process may be performed as the last step of a fabrication process.

In some embodiments the interface between the protonic electrolyte-reservoir 304 and the active channel 303 can function as an ionic separator. The electrolyte-reservoir layer 304 is contacted by a gate contact 305 (e.g. a hydrogen-inert gate contact).

Example materials for the gate contact 305 include but are not limited to: copper (Cu), tungsten (W) and hydrogen annealed poly-Si.

A proton barrier layer 306 is disposed to encapsulate protonic memory 300 to thereby retain the protons inside the device for the extent of device lifetime. Materials suitable for fabrication of the proton barrier layer 306 include, but are not limited to, silicon carbide (SiC), silicon nitride ($Si_3N_4$), aluminum oxide ($Al_2O_3$), chromium oxide ($Cr_2O_3$), yttrium oxide ($Y_2O_3$), erbium oxide ($Er_2O_3$), titanium nitride (TiN), titanium carbide (TiC) or a layered combination of thereof. The materials are realized on an electronically insulating substrate 301.

As noted above in conjunction with FIGS. 1 and 2, access points (e.g. vias) may be provided (e.g. etched or otherwise provided) in layer 306 to allow physical access to contacts 302a, 302b, 305 (e.g. such that electrical connection may be made to contacts 302a, 302b, 305). Such access points are preferably far away from the active region of device 300. In embodiments, contacts 302a, 302b, 305 may correspond to source, drain and gate electrodes of the device 300.

Figure 4:
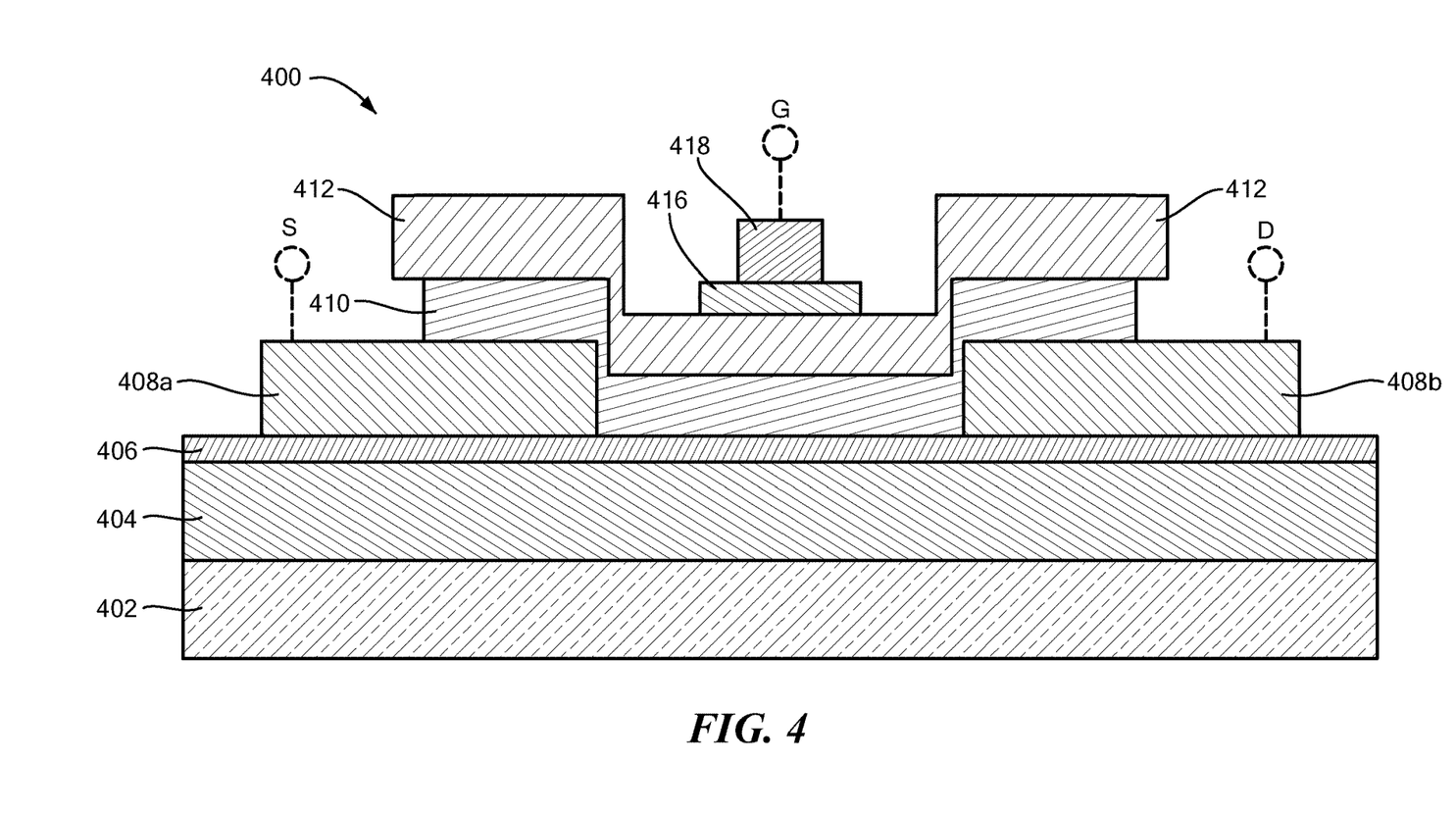
FIG. 4 is a cross-sectional view of an example embodiment of a protonic resistive memory.

Referring now to FIG. 4, an example embodiment of a protonic resistive device 400 includes a substrate 402 provided from an electronically insulating substrate material such as quartz ($SiO_2$) or sapphire ($Al_2O_3$), for example. Disposed on a surface of substrate 402 is a layer 404 of aluminum oxide ($Al_2O_3$) and disposed over the $Al_2O_3$ layer 404 is a layer of inert material 406. In embodiments, inert material layer 406 may comprise hafnium dioxide (hafnia) ($HfO_2$), for example.

A pair of spaced-apart contacts 408a, 408b are disposed on a surface of the $HfO^2$ layer 406. In embodiments, contacts 408a, 408b comprise a hydrogen-inert metal. Contacts 408a and 408b may, for example, comprise one or more of: copper (Cu), tungsten (W) and hydrogen annealed poly-silicon (poly-Si). Other materials may, of course, also be used.

A metal oxide layer 410 is disposed over a surface of inert material layer 406 and is coupled to the hydrogen-inert metal contacts 408a, 408b to form a channel region (and hence metal oxide layer 410 is also sometimes referred to as a metal oxide channel 410 or an active channel 410). In this example embodiment, portions of metal oxide layer 410 are disposed over portions of contacts 408a, 408b.

In embodiments, the active channel 410 may be fabricated by patterning a metal oxide such as tungsten trioxide ($WO_3$) on layer 406. Other fabrication techniques may, of course, also be used. Channel layer 410 may comprise one or more of the following materials including, but not limited to: molybdenum trioxide ($MoO_3$), niobium pentoxide ($Nb_2O_5$), tantalum pentoxide ($Ta_2O_5$), vanadium pentoxide ($V_2O_5$), vanadium dioxide ($VO_2$), and strontium cobalt oxide ($SrCoO_{2.5}$). It should of course be appreciated that other materials may also be used and that combinations of these and other materials may be used. Layer 410 may comprise any material or combination of materials capable of forming a metal oxide channel. Layer 410 may comprise layered transition metal oxides with protons in them, such as $H_xCoO2$, $H_xMnO2$, $H_xNiO2$ (where x denotes a number indicating proton content per unit formula) as well as layered titanium oxides ($Ti_xOy$). Layer 410 may comprise metal oxides, or more specifically d-block transition metal oxides.

An electrolyte layer 412, here provided as a proton conducting solid electrolyte layer 412, is disposed over metal oxide layer 410. In this example embodiment, electrolyte layer 412 is provided as a proton conducting solid electrolyte layer comprising phosphorous and an oxide. In embodiments, proton conducting solid electrolyte layer 412 comprises phosphosilicate glass (PSG). In embodiments, proton conducting solid electrolyte layer 412 may comprise P-doped silicon dioxide ($SiO_2$) or phosphosilicate glass ($P_2O_5$-$SiO_2$) or modified versions thereof. In embodiments, the P-doped $SiO_2$ or phosphosilicate glass ($P_2O_5$-$SiO_2$) may be deposited using plasma enhanced chemical vapor deposition (PECVD) techniques. Other techniques, may of course, also be used including but not limited to grafting and acid-functionalization. The proton conducting solid electrolyte layer 412 is designed to have negligible electronic conductivity at operating conditions. Various combinations of materials comprising phosphorous, and an oxide may be used to provide electrolyte layer 412.

In this example embodiment, electrolyte layer 412 is in direct contact with channel layer 410. According to one embodiment, electrolyte layer 412 may comprise silicon dioxide ($SiO_2$) deposited via PECVD techniques at low temperatures A hydrogen absorbing metal layer 416 may be patterned or otherwise disposed in direct contact with the electrolyte layer 412. Hydrogen absorbing metal layer 416 acts as a proton reservoir and thus may sometimes be referred to here as a reservoir layer 416 (or more simply reservoir 416). In embodiments reservoir layer 416 may comprise one or more of the following materials including, but not limited to: palladium (Pd), platinum (Pt), titanium (Ti), Zirconium (Zr), Molybdenum (Mo), and group 5 metals including but not limited to Niobium (Nb), Vanadium (V), Tantalum (Ta), and all their alloys with each other, and with other elements. In short, reservoir layer 416 may comprise any hydrogen absorbing metals and their alloys which are considered as alternatives to Pd in hydrogen membrane applications. In embodiments the reservoir layer 416 may be protonated via proton implantation as the last step of fabrication. In embodiments, metal oxide layer 416 may be provided as an alloy (e.g. an alloy of palladium with metallic hydrogen $PdH_x$).

Combinations of these and other materials may be used. Layer 416 may comprise any material or combination of materials capable of acting as a proton reservoir.

In one illustrative embodiment, protonation of the reservoir layer 416 may be accomplished via a proton implantation process. In one embodiment a proton implantation process may be performed as the last step of a fabrication process.

Other methods for protonating the reservoir layer 416 include, but are not limited to, following a process such as atomic layer deposition (ALD), chemical vapor deposition (CVD) or plasma-enhanced chemical vapor deposition (PECVD) where the metal oxide is formed through a chemical reaction between two or more precursors, which leave residual hydrogen-containing biproducts inside the electrolyte layer. In some embodiments, post-processing of the reservoir layer 416 with energetic ion, electron or photon irradiation can liberate protons from their sites, contributing to the proton concentration or conduction.

A gate contact 418 is disposed over the reservoir layer 416. In embodiments, gate contact 418 is provided from a hydrogen-inert metal. Example materials for the gate contact 418 include, but are not limited to: copper (Cu), tungsten (W) and hydrogen annealed poly-Si.

Although not specifically illustrated in FIG. 4, device 400 may also comprise a proton barrier layer (i.e. encapsulation layer) disposed to encapsulate protonic memory 400 thereby retaining the protons inside the device for the extent of the device lifetime. A conventional encapsulation layer such as that shown and described above in conjunction with FIGS. 1-3 may be disposed over device 400 and such an encapsulation layer may comprise openings or vias through which electrical connections may be made to contacts 408a, 408b, 418. Such a proton barrier layer may comprise a variety of different materials including, but not limited to: silicon carbide (SiC), silicon nitride ($Si_3N_4$), aluminum oxide ($Al_2O_3$), chromium oxide ($Cr_2O_3$), yttrium oxide ($Y_2O_3$), erbium oxide ($Er_2O_3$), titanium nitride (TiN), titanium carbide (TiC) or a layered combination of thereof.

It should be noted that electrical connections are shown in phantom (i.e. with dashed lines) in FIG. 4, since they are intended as notional only. As explained above in conjunction with FIGS. 1-3, access points (e.g. vias) may be provided (e.g. etched or otherwise provided) in an encapsulation layer to allow physical access to contacts 408a, 408b, 418 (e.g. such that electrical connections may be made to contacts 408a, 408b, 418) and such access points are preferably far away from the active region of device 400 (i.e., in practical devices, the electrical connections to contacts 408a, 408b, 418 and not made in the active region of the device as notionally illustrated in FIG. 4). In embodiments, contacts 408a, 408b, 418 may correspond to source, drain and gate electrodes of the device 400.

It should be appreciated that in the embodiment of FIG. 4, the electrolyte layer 412 extends past ends of the channel layer 410 while reservoir layer 416 is disposed over only a central portion of the electrolyte layer 412. Further channel and electrolyte layers 410, 412 have thicknesses which are greater than the thickness of the reservoir layer. It should of course be appreciated than in other embodiments one or both of the channel and electrolyte layers 410, 412 may have thicknesses which are less than or equal to the thickness of the reservoir layer. In still other embodiments, a first one of the channel layer 410 and the electrolyte layers 412 may have a thickness which is less than or equal to the thickness of the reservoir layer and a second one of the channel layer 410 and the electrolyte layers 412 may have a thickness which is greater than or equal to the thickness of the reservoir layer.

It should be noted that some embodiments described herein can involve a fabrication process where an energetic beam including, but not limited to, helium ions ($He^+$), argon ions ($Ar^+$) gallium ions ($Ga^+$) electrons ($e^-$) and ultraviolet photons (Ø) is irradiated over the reservoir or electrolyte materials to increase the concentration of dislocations, vacancies, porosity or a combination of thereof. Such modifications can be used to increase the proton conductivity of the materials. Various embodiments are described herein with reference to the related drawings. Alternative embodiments can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

For the sake of brevity, conventional techniques related to making and using aspects of these devices may or may not be described in detail herein. In particular, various aspects of device designs and specific processing methods to implement the various technical features described herein are well known. Accordingly, in the interest of brevity, many conventional implementation details are only mentioned briefly herein or are omitted entirely without providing the well-known system and/or process details. For example, any of the structures described herein may be provided using additive or subtractive processing techniques or a combination of additive and subtractive processing techniques.

The technology described herein may be embodied as a method, of which at least some acts have been described. The acts performed as part of the method may be ordered in any suitable way. Accordingly, embodiments may be implemented in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment, various alterations, modifications, and improvements will readily occur to those skilled in the art. Such alterations, modifications, and improvements are intended to be within the spirit and scope of the invention. Accordingly, the foregoing description is by way of example only and is not intended as limiting. The subject matter defined in the appended claims is not necessarily limited to the specific implementations described above. The specific implementations described above are disclosed as examples only.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The invention claimed is:

1. A protonic resistive memory comprising:
a substrate having first and second opposing surfaces;
first and second contacts disposed on the second surface of the substrate, the first and second contacts spaced apart and provided from a hydrogen inert material;
a first metal oxide layer having a first surface disposed over at least a portion of the second surface of the substrate between the first and second contact to form a channel region, the first metal oxide layer disposed over at least a portion of the first contact and over at least a portion of the second contact, the first metal oxide layer forming a metal oxide channel layer;
a proton conducting solid electrolyte layer having a first surface disposed over the second surface of the first metal oxide layer, the proton conducting solid electrolyte layer comprising a phosphorus-doped oxide (P-doped oxide);

a protonated reservoir layer having a first surface disposed over a second surface of the proton conducting solid electrolyte layer; and a third contact disposed over the protonated reservoir layer to define a gate structure.

2. The protonic resistive memory comprising of claim 1 wherein the proton conducting solid electrolyte layer comprises at least one of:
   P-doped silicon dioxide ($SiO_2$); and
   phosphosilicate glass ($P_2O_5$-$SiO_2$).

3. The protonic resistive memory of claim 1 wherein the protonated reservoir layer comprises one of:
   a second metal oxide layer having a first surface disposed over the second surface of the proton conducting solid electrolyte layer; and
   a hydrogen absorbing metal layer.

4. The protonic resistive memory of claim 1 wherein the electrolyte layer is provided from a material having negligible electronic conductivity at operating conditions.

5. The protonic resistive memory of claim 1 wherein the proton conducting solid electrolyte layer comprises P-doped $SiO_2$ deposited via plasma enhanced chemical vapor deposition (PECVD).

6. The protonic resistive memory of claim 2 wherein the proton conducting solid electrolyte layer comprises phosphosilicate glass ($P_2O_5$-$SiO_2$) deposited via plasma enhanced chemical vapor deposition (PECVD).

7. The protonic resistive memory of claim 5 wherein the PECVD is performed at temperatures of about 100° C.

8. The protonic resistive memory of claim 3 wherein the protonated reservoir layer is a hydrogen absorbing metal layer comprising one or more of: palladium (Pd), platinum (Pt), titanium (Ti), Zirconium (Zr), Molybdenum (Mo), and group 5 metals including but not limited to Niobium (Nb), Vanadium (V), Tantalum (Ta), and all their alloys with each other and with other elements.

9. A protonic resistive memory comprising:
   a substrate having first and second opposing surfaces;
   first and second contacts disposed on the second surface of the substrate, the first and second contacts spaced apart and provided from a hydrogen inert material;
   a metal oxide channel layer having a first surface disposed over at least a portion of the second surface of the substrate between the first and second contact, the metal oxide channel layer disposed over at least a portion of the first contact and over at least a portion of the second contact to form a proton-sensitive active layer;
   a proton conducting solid electrolyte layer having a first surface disposed over the second surface of the metal oxide channel layer, the proton conducting solid electrolyte layer comprising phosphosilicate glass (PSG);
   a proton reservoir layer having a first surface disposed over a second surface of the proton conducting solid electrolyte layer; and
   a third contact disposed over the proton reservoir layer to define a gate structure.

10. The protonic resistive memory of claim 9 wherein the metal oxide channel layer comprises at least one of:
    tungsten trioxide ($WO_3$);
    molybdenum trioxide ($MoO_3$);
    niobium pentoxide ($Nb_2O_5$),
    tantalum pentoxide ($Ta_2O_5$),
    vanadium pentoxide ($V_2O_5$),
    vanadium dioxide ($VO_2$), and
    strontium cobalt oxide ($SrCoO_{2.5}$).

11. The protonic resistive memory of claim 9 wherein the proton reservoir layer comprises at least one of:
    tungsten trioxide ($WO_3$);
    molybdenum trioxide ($MoO_3$);
    niobium pentoxide ($Nb_2O_5$),
    tantalum pentoxide ($Ta_2O_5$),
    vanadium pentoxide ($V_2O_5$),
    vanadium dioxide ($VO_2$), and
    strontium cobalt oxide ($SrCoO_{2.5}$).

12. A protonic resistive memory comprising:
    a metal oxide layer as a proton-sensitive active layer, the metal oxide layer having contacts which define a channel structure in the metal oxide layer;
    a proton conducting solid electrolyte layer disposed on the proton-sensitive active layer, the proton conducting solid electrolyte layer comprises at least one of: (1) P-doped silicon dioxide; and (2) phosphosilicate glass;
    a proton absorbing metal layer as the proton reservoir disposed over the proton conducting solid electrolyte layer; and
    a proton insulating encapsulant layer disposed over the metal oxide layer, proton conducting solid electrolyte layer and the proton absorbing metal layer.

13. A process of forming protonic resistive memory comprising:
    depositing a first metal oxide layer as proton-sensitive active layer;
    contacting the proton-sensitive active layer from two ends to define a channel structure;
    depositing a proton conducting solid electrolyte on top of the active layer;
    depositing a second metal oxide layer as proton reservoir on top of the solid electrolyte;
    contacting the top metal oxide layer to define a gate structure;
    depositing an encapsulant layer of proton insulating nature; and
    opening windows in the upper surface of the encapsulant layer to create electrical contact to the upper metal layer.

14. The process of claim 13 further comprising implantation of hydrogen to the
    top metal oxide layer as the source of protons in the stack.

15. A process of forming protonic resistive memory comprising:
    depositing a metal oxide layer as proton-sensitive active layer;
    contacting the proton-sensitive active layer from two ends to define a channel structure;
    depositing a proton conducting solid electrolyte on top of active layer;
    depositing a first layer of hydrogen soluble metal;
    depositing a second layer of hydrogen inert metal;
    depositing an encapsulant layer of proton insulating nature;
    opening windows in the upper surface of the encapsulant layer to create electrical contact to the upper metal layer; and
    implanting hydrogen into the upper metal layer.

16. The process of claim 15, further comprising increasing the proton conductivity of the materials by increasing the porosity and vacancy concentration.

* * * * *